US006813590B1

(12) United States Patent
Crusius

(10) Patent No.: US 6,813,590 B1
(45) Date of Patent: Nov. 2, 2004

(54) METHOD FOR PROVIDING CONVEX PIECEWISE-LINEAR EXPRESSION FOR MULTIPLE VARIABLE SYSTEM

(75) Inventor: Cesar Crusius, Stanford, CA (US)

(73) Assignee: Barcelona Design, Inc., Sunnyvale, CA (US)

( * ) Notice: Subject to any disclaimer, the term of this patent is extended or adjusted under 35 U.S.C. 154(b) by 0 days.

(21) Appl. No.: 09/475,734

(22) Filed: Dec. 30, 1999

(51) Int. Cl.[7] .......................... G06F 17/50; G06F 17/10; G06F 7/60
(52) U.S. Cl. ............................................. 703/2; 703/1
(58) Field of Search ......................... 703/2, 1; 700/121

(56) References Cited

U.S. PATENT DOCUMENTS 5,373,457 A * 12/1994 George et al. ............... 327/334
5,692,107 A * 11/1997 Simoudis et al. .............. 706/12
5,774,382 A * 6/1998 Tyler et al. .................... 703/2
6,253,164 B1 * 6/2001 Rohm et al. ................... 703/2
6,269,277 B1 * 7/2001 Hershenson et al. ........ 700/121

OTHER PUBLICATIONS

Heredia et al., "Piecewise Linear System Modeling Based on a Continuous Threshold Decomposition", IEEE Transactions on Signal Processing, vol. 44, Issue 6, Jun. 1996, pp. 1440–1453.*

* cited by examiner

*Primary Examiner*—Hugh Jones
(74) *Attorney, Agent, or Firm*—Blakely, Sokoloff, Taylor & Zafman, LLP

(57) ABSTRACT

A method for providing a convex piecewise-linear expression which can be used for a system having thousands of variables is described. Data regions are defined and planes fitted to the data with the limitation that no plane exceeds the data by more than a set tolerance. A set of planes is formed and planes are added to the set one at a time found on the amount error reduction. After a plane is added to the set refitting occurs and another plane is selected for inclusion into the set.

10 Claims, 7 Drawing Sheets

METHOD FOR PROVIDING CONVEX PIECEWISE-LINEAR EXPRESSION FOR MULTIPLE VARIABLE SYSTEM

FIELD OF THE INVENTION

The invention relates the field of fitting mathematical expressions to data.

PRIOR ART

There are many known techniques for fitting both continuous functions and piecewise-linear expressions to data. These techniques have become more important recently since with current computing power it is now possible to rapidly solve mathematical expressions that were not solvable a few decades ago. Moreover, as the cost of computing power decreases new opportunities arise for solving problems in unexplored fields.

Where a few variables and tens or hundreds of data points are involved, techniques using heuristic approaches and intuition may be adequate. It is known, for instance, to use a piecewise-linear fitting representing the characteristics of transistors where the maximum value of all of the piecewise planes approximate the data. The breakpoint of the planes are selected heuristically since the operation of transistors are relatively simple and well understood. On the other hand, a complex problem such as airline scheduling may involve hundreds of thousands of variables with no intuitive guidelines to set initial bounds. There are countless other systems having thousands of variables which defy an intuitive approach. Thus there is a continuing need for rigorous methods that allow for the developing of expressions especially for complex systems.

Additionally, mathematical expressions that can be expressed as, or converted to, posynomial expressions lend themselves to geometric programs. These programs can be solved with efficient interior-point methods. This technique is known particularly for solving electrical circuit problems. See "CMOS Operational Amplifier Design In Optimization Via Geometric Programming," by Hershenson, Boyd and Lee, Proceedings of the First International Workshop on Design of Mixed Mode Integrated Circuits and Applications, July 97 and "Automated Design of Folded-Cascode Op Amps with Sensitivity Analysis," by Herschenson, Boyd and Lee, $5^{th}$ IEEE International Conference on Electronics, Circuits and System, September 98.

SUMMARY OF THE INVENTION

A computer implemented method for providing a mathematical representation of a system having a plurality of variables is disclosed. Planes are fitted to the data where each plane deviates from the data by no more than a predetermined tolerance in one sense. A plane is selected for inclusion in a set of planes if inclusion reduces the error between the set of planes and the data. After a plane is added to the set, refitting occurs and another plane is selected for inclusion in the set. This continues until there is no reduction in error from adding planes to the set. The maximum value of the planes in the set forms an expression which represents the data.

In an alternate embodiment a look ahead method is used which determines whether the inclusion of a particular plane in the set provides for more error reduction when taking into account the inclusion of planes in subsequent iterations.

In addition methods are described for providing a max-monomial approximation as well as a posynomial approximation.

DETAILED DESCRIPTION OF THE INVENTION

A computer implemented method is described for the piecemeal or piecewise fitting of planes to data. In the following description, specific details, such as are shown in some of the drawings, are used to provide an understanding of the present invention. It will be apparent that the present invention may be practiced without these details. In other instances well-known methods and algorithms have not been set forth in detail in order not to unnecessarily obscure the present invention.

The disclosed method is useful for providing a mathematical expression for systems having virtually any number of variables (e.g., in excess of 100,000) using a commonly available personal computer or workstation.

As can be appreciated, it is difficult to illustrate the fitting of planes to a system having multiple variables. In many of the figures in this application, data is represented by a simple two-dimensional function such as the curve 40 of FIG. 5 and planes are represented by straight lines such as lines 41 and 42 of FIGS. 5 and 6.

The algorithm for function fitting of the present invention provides an approximation of the form $$f(x) \approx \max_j(a_j^T x + b_j) \quad (1)$$

where it is assumed that the function to be fitted is scalar-valued and where $x \in R^n$. The input to the algorithm is a set of pairs $(x_i, f(x_i))$ and a pair$(a_j, b_j)$ is a plane.

Initially, it is assumed that data representing a system is stored, for instance, in a computer memory. This is shown as step 10 of FIG. 1. A plane is selected which does not cover any of the data. More precisely, a point $y_i = f(x_i)$ is covered if $$|f(x_i) - y_i| \leq \text{tol}. \quad (2)$$

Figure 5:
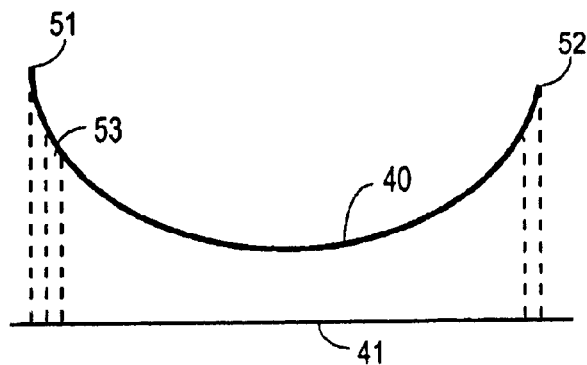
FIG. 5 shows a curve representing data and a single plane spaced-apart from the data.

Referring briefly to FIG. 5 assumed the data is represented by the curve 40, the plane 41 does not cover any of the data. This selection of a plane is step 20 of FIG. 2.

Now planes are fitted to the data, is for example to curve 40, for regions of data. This is done in one embodiment by determining the maximum error between the plane 41 and the data. The maximum error is illustrated by point 51 of FIG. 5 (step 21 of FIG. 3). A region is defined to include the data associated with point 51 and then a plane is fitted to the data for this region. The manner in which the plane is fitted to the data is discussed below. The size of the region, that is the amount of data in the region, is selected based on criteria such as, the maximum number of regions necessary to cover all the data, the nature of the data, for instance, how quickly the data change relative to the tolerance, and the degree of accuracy sought by the algorithm. The size of the regions can vary for each iteration and is automatically selected.

Figure 3:
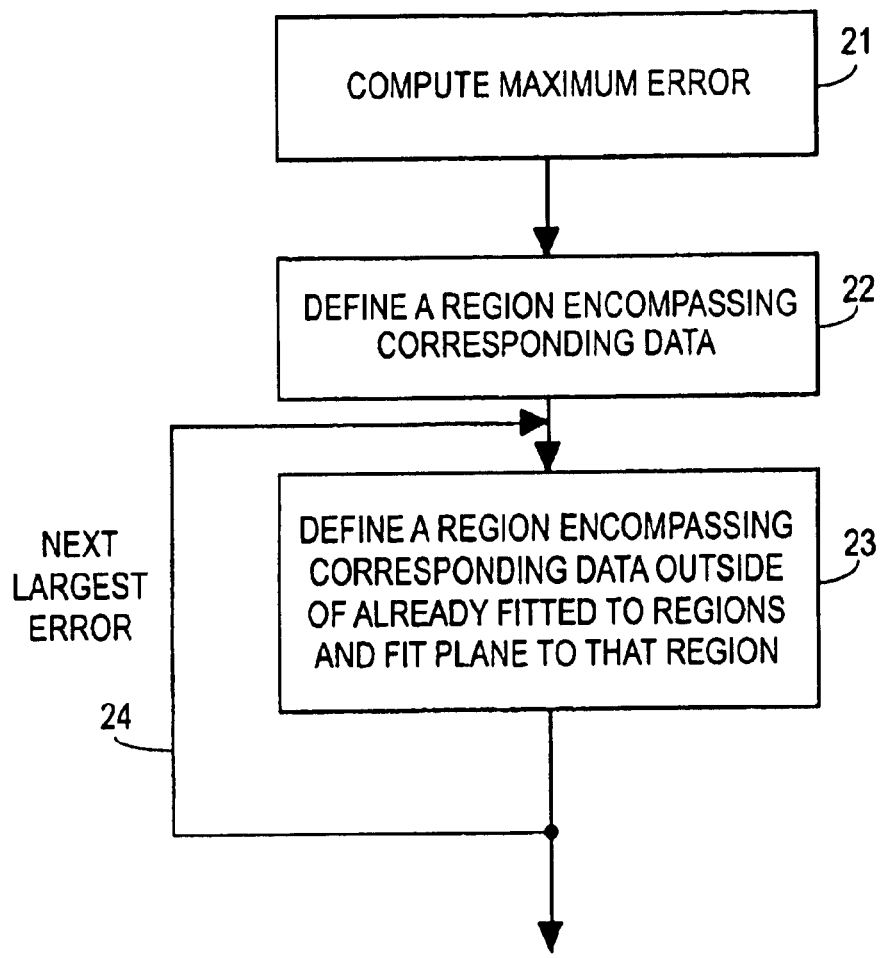
FIG. 3 is a flow diagram illustrating the steps associated with the fitting of planes to regions of data.

After the first plane is fitted the next largest error between the plane 41 and the data not falling within the first region is found. This is illustrated as point 52 in FIG. 5. A region is associated with that data and a plane is fitted to that data. The next largest error is found for the remaining unfitted data and a plane is again fitted to a data in a region associated with that error. This is illustrated by region 53 for the data in FIG. 5. This process continues until planes are fitted to all the data. In FIG. 3 the steps for this are shown as step 22 "select largest error and define a region encompassing corresponding data," and step 23 "select next largest error and define a region encompassing corresponding data outside of existing regions." Step 23 is repeated as shown by path 24 until all the data is encompassed in regions and a plane is fitted to the data in each region.

There are numerous well-known techniques for fitting a plane to data which may be used for defining a plane for the data in each of the regions. A well-known technique for a regression fit is used is one embodiment. In one embodiment the weighted sums of the absolute errors is used to fit the data. (This is somewhat a deviating from much of the prior art which uses a weighted sum of the squares of the deviation.) Thus the fit minimizes locally $$\Sigma \text{weight} |f(x_i) - g(x_i)| \quad (3)$$

Other type of error (e.g. maximum error) can be used without loss of efficiency provided that the resulted minimization problem remains convex.

There is however an important limitation in this fitting in that in no event can the locally fitted plane outside the region for which the plane is fitted exceed a preset tolerance in one direction or sense as represented by $$g(x_i) \leq f(x_i) + \text{tol.} \quad (4)$$

Figure 1:
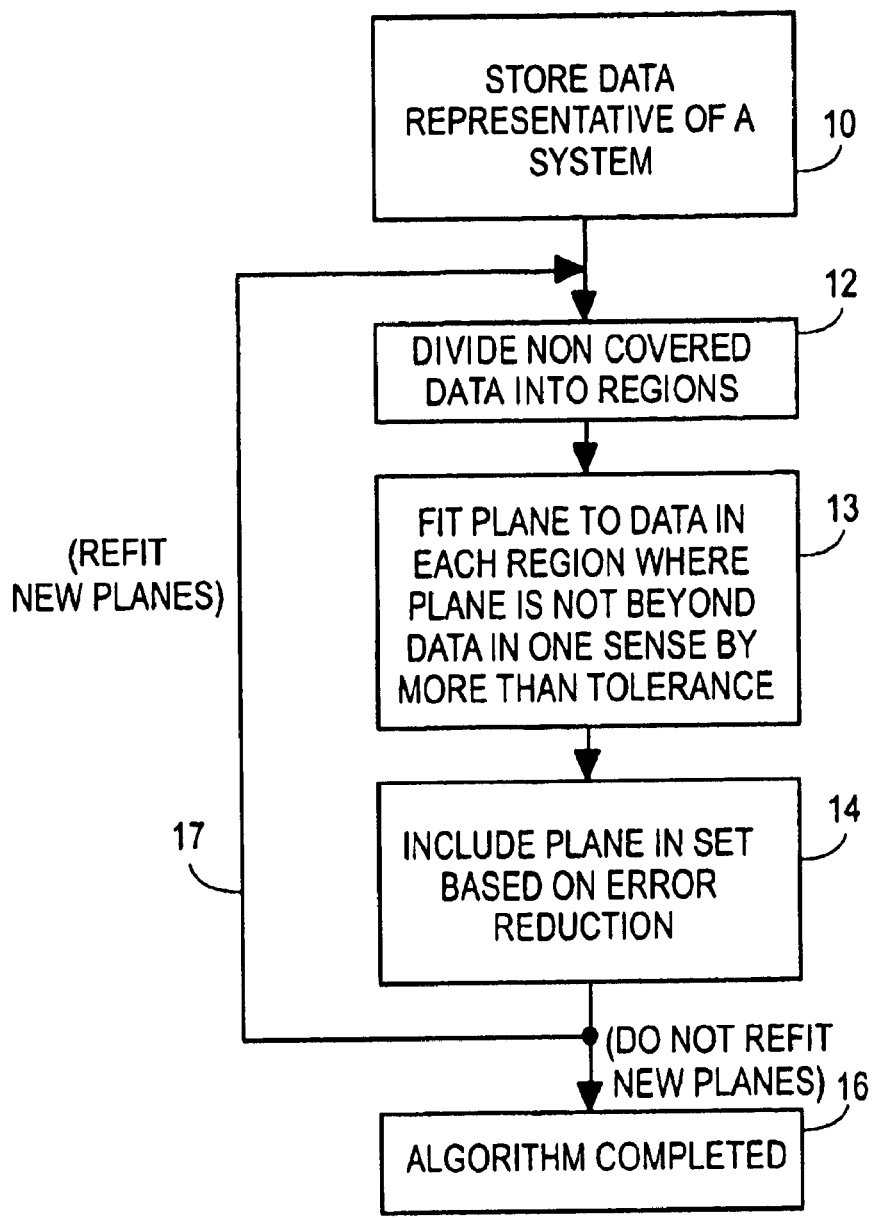
FIG. 1 is a flow diagram illustrating the major steps in the method of the present invention.

This is shown in FIG. 1 as step 13 "fit plane to data in each region where plane is not beyond data in one sense by more than tolerance."

Figure 12:
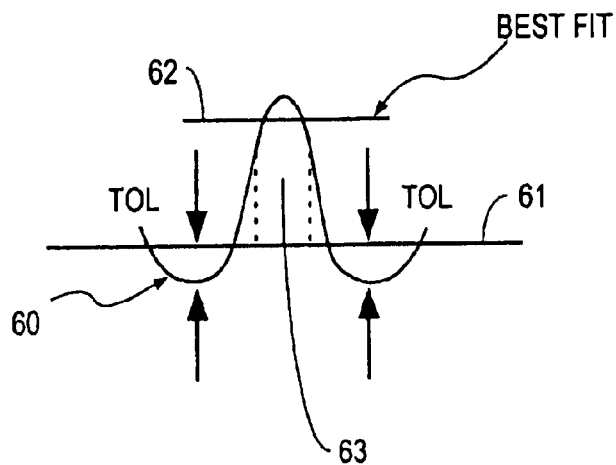
FIG. 12 illustrates a curve representing data and two planes one which provides a best fit and the other which deviates from the data by a predetermined tolerance in one sense.

The limitation of equation 4 is shown graphically in FIG. 12. Assumed that curve 60 represents the data. As can be seen from the sin x—like shape of this curve, this curve cannot be fitted to a reasonable precision with a convex piecewise-linear fitting. The data may represent, for example, some data anomaly in an otherwise convex system. Assume further that data is to be fitted to region 63. The best fit is represented by plane 62. However, plane 62 is above the data by more than the tolerance outside of region 63, hence it does not satisfy the limitation of equation 4. Plane 61 on the other hand, while it is not the best fit, it is the best fit that satisfying equation 4. Consequently plane 61 is used in the present invention to preserve the condition of equation 4. As the algorithm progresses, as will be discussed, each time data not covered by a plane as defined by equation 2 is identified, region 63 may again be selected and the fitting process will again result in the plane 61.

The next step in the algorithm, step 14 of FIG. 1, is the selection of planes for inclusion in a set of planes. The set of planes ultimately provides the final piecewise fitting of the data. The set is formed by adding one plane at a time and by testing the error resulting from the addition of that plane to the set. The plane that results in the greatest reduction in error is selected for inclusion in the set. This is repeated for each iteration of the algorithm. (This error used for the selections of a plane is not the error discussed in connection with FIG. 5, as will be explained).

Initially, the only plane in the set is plane 41 which does not cover any data as shown in FIG. 5. This plane is deleted from the set after the first iteration as will be described.

Figure 6:
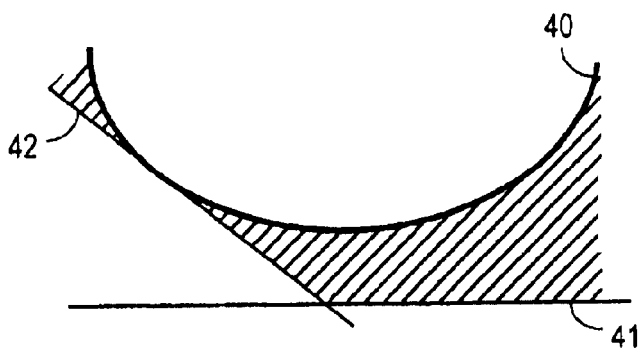
FIG. 6 illustrates a single plane fitted to the curve of FIG. 5 and the error between the plane and data.
Figure 7:
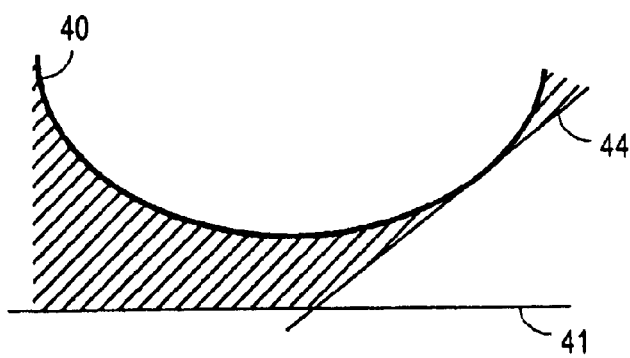
FIG. 7 illustrates another plane fitted to the curve of FIG. 5 and if the associated error.
Figure 8:
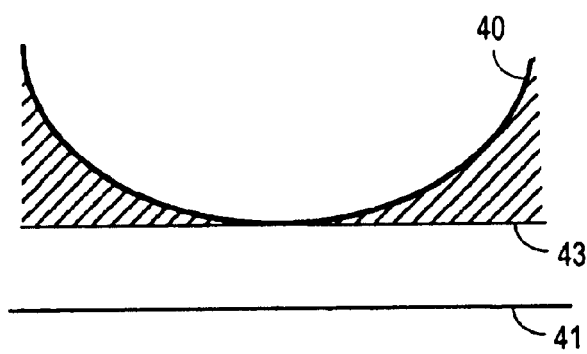
FIG. 8 illustrates yet another plane fitted to the curve of FIG. 5 and the associated error.

Assume that the data is initially fitted by three planes represented in FIGS. 6 through 8 as planes 42, 43 and 44. (This is a simplification from the smaller regions shown in FIG. 5 to better illustrate the method). First assume that plane 42 is included in the set. The error between plane 42 and the data is determined. This error is shown by the shaded area in FIG. 6. The maximum value of the planes 41 and 42 are taken and compared to the data to computed the error.

Similarly, as shown in FIG. 7 the maximum values of the planes 41 and 44 are computed and compared to the data and the error found, as shown by the shaded area in FIG. 7. Finally, as shown in FIG. 8 the error between the maximum values of the planes 41 and 43 and the data is computed. In this case since plane 43 is shown to be substantially parallel to plane 41, the value associated with plane 43 determine the error since it has the maximum values for all regions.

The plane that provides the least error is now included in the set. Assume for sake of discussion that plane 42 is the plane that is included in the set.

As shown by line 17 of FIG. 1, the next step in the algorithm is to again fit planes to the data. Any data not covered by a plane as defined by equation 2 is refitted. In one embodiment what occurs is once again the largest error is determined as shown by step 22 of FIG. 3, a plane is fitted to the data is the region associated with that error. Then the next largest error, as shown by step 23, is determined and a plane is fitted to the region associated with that error. This continues until all the data not covered is fitted. It should be noted that if for instance plane 42 is selected and refitting occurs that planes 43 and 44 will not necessarily reoccur, and in fact it is unlikely that they will reoccur. The reason for this is that plane 42 was selected for a particular region. Plane 42 may also fit other data outside of the region for which it was initially fitted. Consequently after plane 42 is selected for the set and refitting occurs a new set of planes will emerge. This is shown in FIG. 1 as step 13.

Now each plane of the newly fitted planes is considered with the planes in the set of planes and the error determined. The one plane of the newly fitted planes that most reduces the error is included in the set. Then another iteration occurs as shown by line 17, where the regions are again determined, and another group of planes is fitted. And once again the plane of this group that most reduces the error is added to the set. This continues until there is no reduction in error by inclusion of new planes. At this point the algorithm is completed as shown by step 16.

Figure 9:
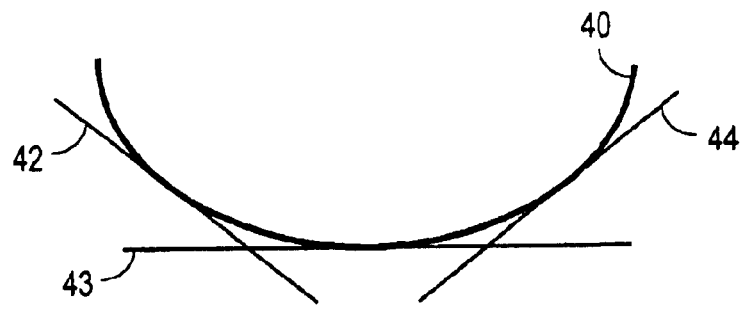
FIG. 9 illustrates three planes fitted to the curve of FIG. 5.
Figure 10:
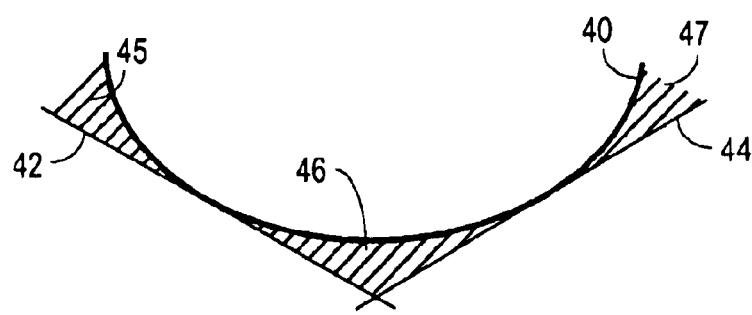
FIG. 10 illustrates the error associated with two of the planes of FIG. 9.
Figure 11:
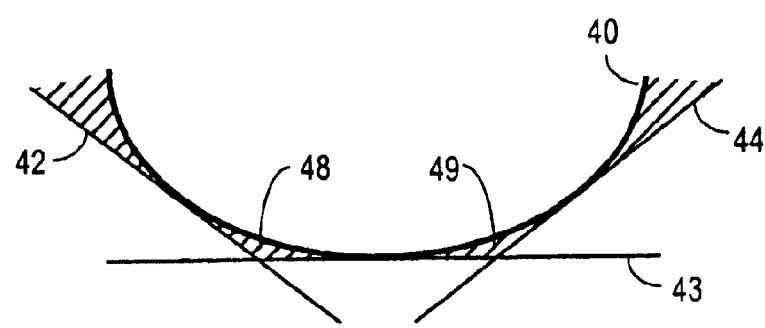
FIG. 11 illustrates the error associated with the three planes of FIG. 9.

FIGS. 9, 10 and 11 are used to illustrate the reduction of error resulting from the addition of a plane to the set. Assume that the set of planes only includes plane 42 and 44. Assume further that once steps 12 and 13 of FIG. 1 occur, plane 43 is fitted to a region. The error associated with planes 42 and 44 is shown in FIG. 10 by the three areas 45, 46 and 47. When plane 43 is included, the error associated with the region 46 of FIG. 10 is reduced to areas 48 and 49 which provide less error than area 46 of FIG. 10. Thus for this discussion, plane 43 would be selected for inclusion in the set. If on the other hand, the inclusion of plane 43 did not reduce the area 46, the fitting would have been completed as shown by step 16 of FIG. 1.

Figure 2:
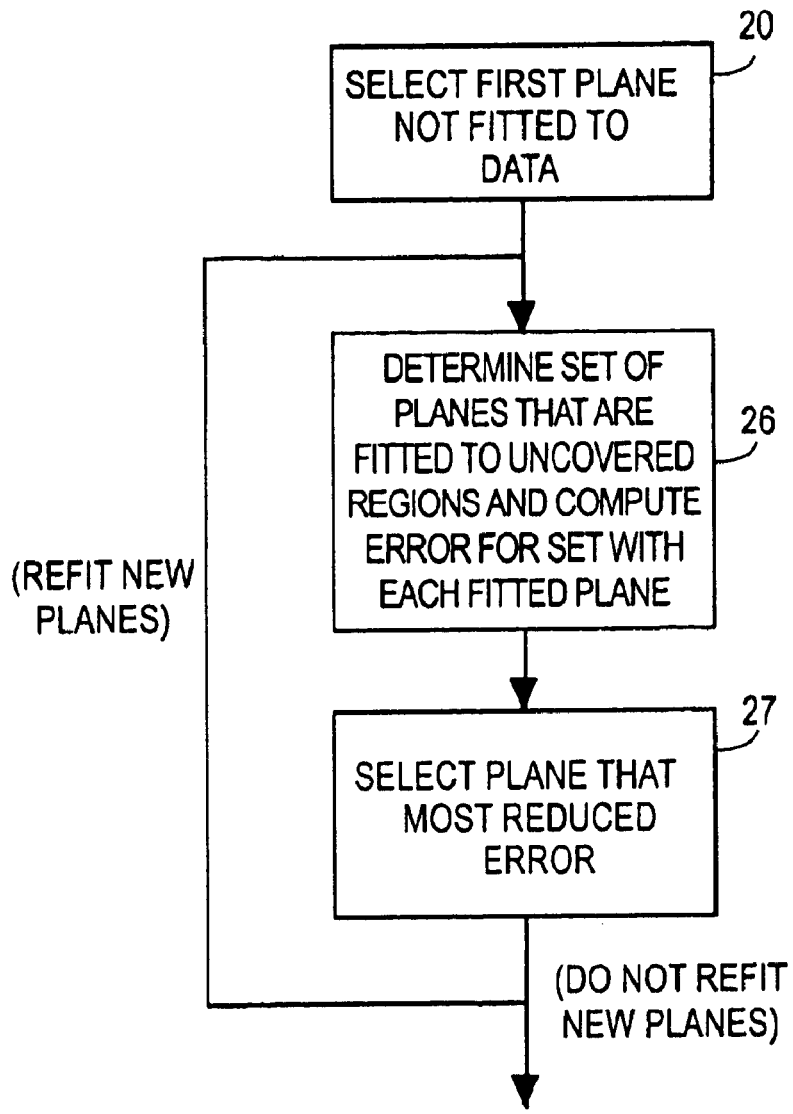
FIG. 2 shows in more detail one of the steps (step 14) of FIG. 1.

FIG. 2 illustrates the steps discussed above for determining what is to be included in a set. There is a first pass where a first plane (plane 41) of FIG. 5 is selected which is apart from the data as discussed. Then as discussed in conjunction with FIG. 6, 7 and 8 the error is computed as shown by step 26. Now as shown by step 27 the plane that most reduce the error is selected. Steps 26 and 27 are repeated for each iteration each time there are newly fitted planes. The plane 41 is dropped from the set since after the first few iterations, it no longer plays any part in computing the error.

It should be noted from the above that without the condition of equation 4, it is very difficult to devise an algorithm that ensures that equation 1 will give a reasonable fit whenever such a fit exists. For instance, if plane 62 of FIG. 12 were selected, it would provide the maximum value over many regions for which it was not fitted and for which it is a very bad fit. Also, if one of the planes such as plane 62 of FIG. 12 was globally above the data outside of its associated region, it would be indistinguishable from other planes when the error is computed. This would make the selection of the plane that most reduces the error difficult. Again note that the error associated with determining which plane should be included in a set should not be confused with the error used to define regions to which data is to be fitted as discussed in conjunction with FIG. 3.

The above method can readily be implemented with a computer program, for instance, programmed using C++. In one embodiment this was done with approximately 2000 lines of code. This excludes the fitting of a plane to data step which is done with a separate program for-this embodiment. There are numerous known programs for doing this fitting step. The program can be stored or shipped in any of a plurality of memory devices such as a floppy disk, CD ROM, hard disk, other non-volatile memory, or the like. This entire program provides good results when running on a PC having 512M of RAM and a 400 Mz Pentium® Processor. For example, a system having four variables, 7,000 data points and resulting in an expression having four planes is solved in approximately 30 seconds. (This is without the look ahead feature discussed below). Interestingly this would require several lifetimes to complete manually.

In some cases it may be that the inclusion of a plane in a set of planes may reduce the error by the greatest amount for a particular iteration but that its selection is not the best when taking into account what will occur in subsequent iterations. A method for looking ahead to determine whether the inclusion of a particular plane will provide good results in subsequent iterations may be used. Let n equal the number of iterations for which the look ahead occurs. In the previous discussion n=0 in that there was no look ahead. As will be seen as n increases the number of computation increases dramatically, however the results justify the additional computations in some cases.

Figure 4:
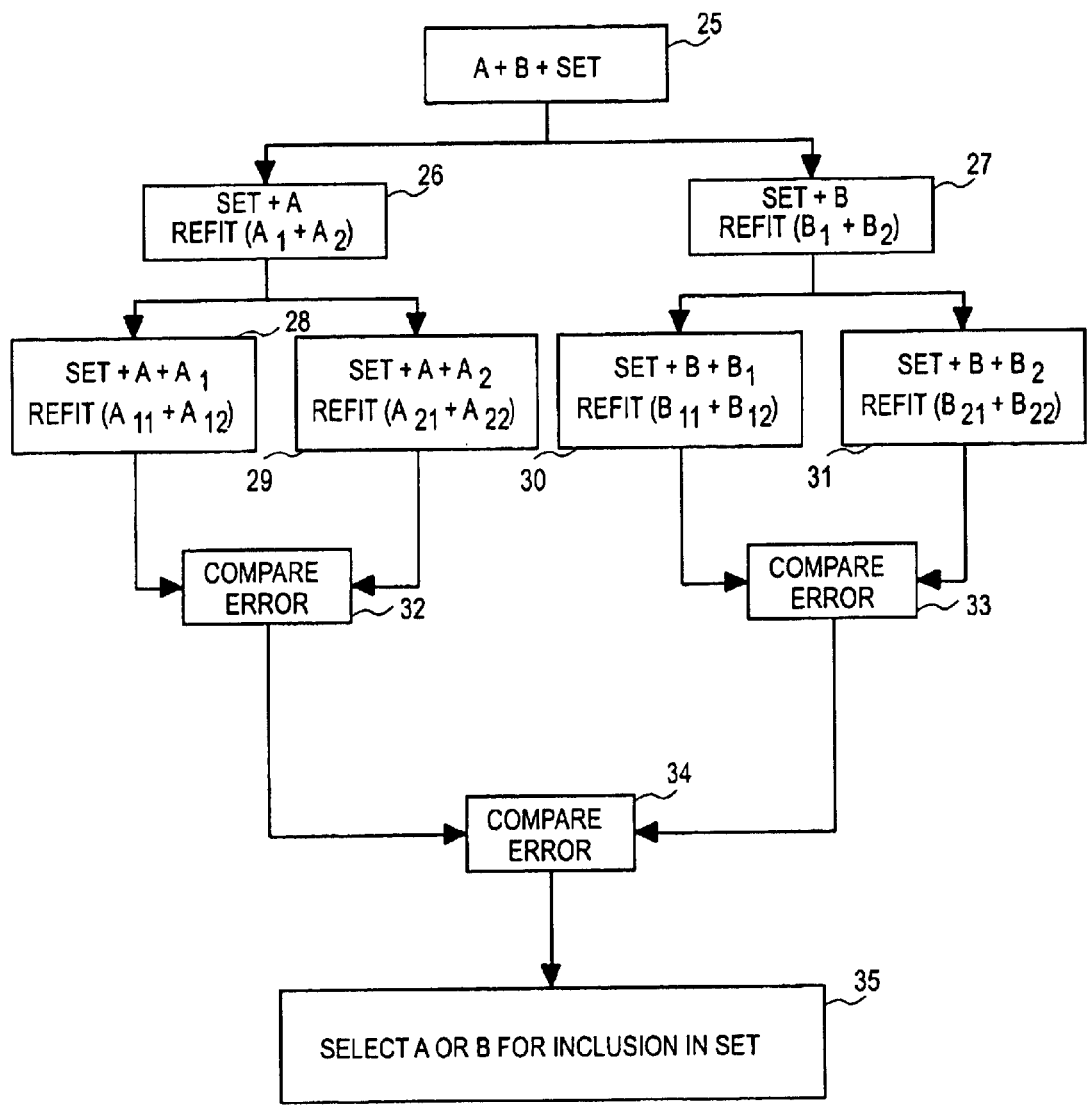
FIG. 4 is a flow diagram illustrating the steps associated with the look ahead method where n=2.

The process for n=2 is shown in FIG. 4. Assume that there is a set of planes that has been selected and that two planes are been fitted to the remaining data (planes A and B) as shown by step 25. If n were equal to 0 the one of the planes A or B that most reduce the error would be selected. With looking ahead both A and B are independently tried in the set as is shown by step 26 and step 27. First plane A is added to the set as shown by step 26. Without any testing for error, the data not covered by the set and plane A is refitted. It is assumed that the refitting results in two additional planes, planes $A_1$ and $A_2$. Similarly as shown by step 27, plane B is assumed to be in the set and refitting occurs. It is again assumed that two planes result from the refitting, planes $B_1$ and $B_2$.

Since n=2 and we are looking ahead again after steps 26 and 27. Now new sets are formed, one including A, and another including $A_2$ as shown by steps 28 and 29. One of these new sets includes the original set from step 25+A+$A_1$ (see step 28). Another new set includes the original set from step 25 and A+$A_2$ as shown by step 29. Again refitting occurs. In step 28 it is assumed that after the set includes A and $A_1$, the refitting results in two additional planes $A_{11}$ and $A_{12}$. Similarly as shown in step 29 it is assume that when A and $A_2$ are added to the original set, a refitting results in planes $A_{21}$ and $A_{22}$.

The same process occurs in connection with the set that includes plane B. As shown by step 30, it is assumed the new set includes B+$B_1$ and after refitting planes $B_{11}$ and $B_{12}$ results. Similarly as shown by step 31 the new set is assumed to include B+$B_2$ and then after refitting planes $B_{21}$ and $B_{22}$ results.

Now the reduction of error is determined for the set with A+$A_1$+$A_{11}$ and the set with A+$A_1$+$A_{12}$. The one of the planes $A_{11}$ or $A_{12}$ that most reduced the error is the one selected for the comparison that occurs in step 32. Similarly the error is computed for the original set+A+$A_2$ when both $A_{21}$ and $A_{22}$ are separately included. The one of $A_{21}$ and $A_{22}$ that most reduces the error is the found. The maximum reduction for error is determined as shown by step 32 between the error determined in step 28 verses step 29.

Similarly the maximum reduction of error is determined by step 33 for the error found at steps 30 and 31. Then in step 34 the error reduction resulting from step 32 is compared to the error reduction from step 33. One of the two provides the maximum reduction. From this it is determined which one of the sets that included the "A" or "B" planes resulted in the most reduction in error. Then either plane A or plane B is selected for inclusion in the original set from step 25 as shown by step 35.

Note all the additional computations required to select between planes A or B as shown in FIG. 4, however in some instances this additional computation is warranted because ultimately with look ahead, planes are selected with an eye towards what will occur in subsequent iteration.

For FIG. 4, if the look ahead is with n=1, at steps 26 and 27 the comparison between the reduction in error occurring at steps 26 and 27 would be compared and one of the planes A or B would be selected.

The above described method can be used to fit a function to a max-monomial approximation by using the log of the data. The result is the function shown below by equation 5

$$f(x)=e^{max_j\{a^T_j \log x + b\}}. \quad (5)$$

In some cases it is desirable to differentiate or integrate an expression. When integrating, for instance, a piecewise-linear expression the result is not a piecewise-linear expression. A function that can be differentiated or integrated is useful, for example to represent electrical circuits, and more specifically a posynomial expression. Taking advantage of equation 5 a new parameter $\epsilon$ can be introduce to provide the function equation 6

$$\tilde{f}(x) = \left( \sum_j e^{\frac{a^T_j \log x + b_j}{\epsilon}} \right)^{\epsilon}, \quad (6)$$

if $\epsilon=1$ equation 6 is a posynomial. As $\epsilon$ approaches 0 the function is a max-monomial approximation almost everywhere.

The expression of equation 6 can be obtain from equation 5 by starting with a small positive $\epsilon$ and gradually incrementing it until $\epsilon=1$. At step "a" and "b" terms are adjusted to locally minimize the 2-norm of the approximation error. Since the function is differentiable, so is the approximation error, thus the local minimization can be performed using the gradient and the Hessian of the error.

Figure 13:
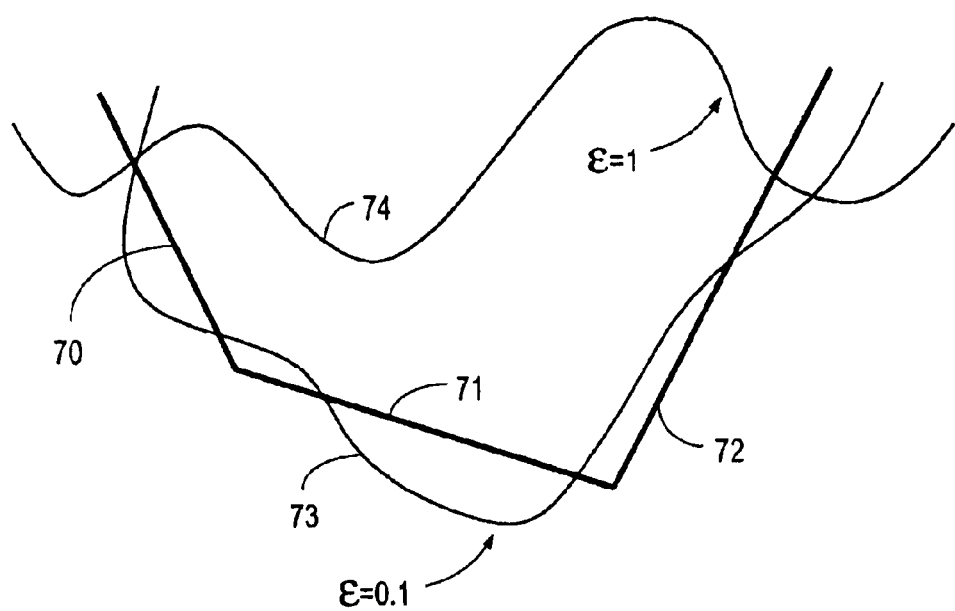
FIG. 13 is a diagram used to illustrate the fitting of a continuous function to the piecewise-linear approximation.

An attempt to show this process graphically is presented in FIG. 13 where the piecewise algorithm resulted in the planes 70, 71 and 72. For $\epsilon=0.1$ the curve 73 is shown.

Adjustments are made at this point to minimize the error so that curve 73 more closely approximates the piecewise approximation. As $\epsilon$ is incremented again in each of the steps the terms are adjusted to minimize the error. Curve 74 shows the function with $\epsilon=1$, before the terms are again adjusted to obtain a posynomial. The process of incrementing E and adjusting at each increment is necessary to obtain a good fit in most cases.

Thus a method has been disclosed for providing a piecewise approximation of data for a system having a plurality of variables.

I claim:

1. A method for providing a mathematical representation of a system having a plurality of variables, comprising:
    a) collecting data representative of the system and storing said data into memory;
    b) identifying a plane which does not cover any of the data;
    c) fitting a plane to a region of the data for each of a plurality of regions that the data is divided into, where, each next fitted plane is fitted to a region that
        i) is not yet fitted to by a plane and
        ii) possesses the maximum error in the data, amongst the regions not yet fitted to, as measured against the plane that does not cover any of the data;
    and where the difference between each fitted plane and the data outside its region does not exceed a predetermined tolerance in one sense;
    d) selecting one of the fitted planes as a first plane for inclusion into a set of planes, the selected one plane being the plane having the least error;
    e) fitting a plane to a region of the data for each of a plurality of regions that the data is divided into, where, each next fitted plane is fitted to a region that:
        i) is not yet fitted to by a plane that has been selected for inclusion into the set of planes and,
    and where the difference between each fitted plane and the data outside its region does not exceed the predetermined tolerance in one sense;
    f) selecting one of the fitted planes from e) as a next plane for inclusion into the set of planes, the selected next plane being the plane that most reduces error by way of its introduction and repeating e) unless said next fitted plane could not be identified because no reduction in error would result by way of its introduction.

2. The method defined by claim 1 wherein said fitting further comprises using weighted sums of absolute errors.

3. The method defined by claim 1 wherein said fitting further comprises regression fitting.

4. The method defined by claim 1 wherein each region of e) where each next fitted plane is fitted to is further characterized in that it:
    ii) possesses the maximum error in the data, amongst the regions not yet fitted to, as measured against a plane that is substantially parallel to the plane that does not cover any of the data.

5. The method defined by claim 1 wherein e) further comprises for each next fitted plane:
    looking ahead to a next iteration, said looking ahead further comprising fitting to regions of the data not covered by the set of planes and the next fitted plane.

6. A computer program product comprising:
    a computer usable medium having computer readable code which when executed causes a method to be performed, the method comprising:
        a) collecting data representative of the system and storing the data into memory;
        b) identifying a plane which does not cover any of the data:
        c) fitting a plane to a region of the data for each of a plurality of regions that the data is divided into, where, each next fitted plane is fitted to a region that:
            i) is not yet fitted to by a plane and
            ii) possesses the maximum error in the data, amongst the regions not yet fitted to, as measured against the plane that does not cover any of the data:
        and where the difference between each fitted plane and the data outside its region does not exceed a predetermined tolerance in one sense;
        d) selecting one of the fitted planes as a first plane for inclusion into a set of planes, the selected one plane being the plane having the least error;
        e) fitting a plane to a region of the data for each of a plurality of regions that the data is divided into, where, each next fitted plane is fitted to a region that:
            i) is not yet fitted to by a plane that has been selected for inclusion into the set of planes:
        and where the difference between each fitted plane and the data outside its region does not exceed the predetermined tolerance in one sense;
        f) selecting one of the fitted planes from e) as a next plane for inclusion into the set of planes, the selected next plane being the plane that most reduces error by way of its introduction and repeating e) unless said next fitted plane could not be identified because no reduction in error would result by way of its introduction.

7. The computer program product defined by claim 1 wherein said fitting further comprises using weighted sums of absolute errors.

8. The computer program product defined by claim 1 wherein said fitting further comprises regression fitting.

9. The computer program product defined by claim 1 wherein each region of e) where each next fitted plane is fitted to is further characterized in that it:
    ii) possesses the maximum error in the data, amongst the regions not yet fitted to, as measured against a plane that is substantially parallel to the plane that does not cover any of the data.

10. The method defined by claim 1 wherein e) further comprises for each next fitted plane:
    looking ahead to a next iteration, said looking ahead further comprising fitting to regions of the data not covered by the set of planes and the next fitted plane.

* * * * *